(12) United States Patent
Ogawa

(10) Patent No.: US 6,909,303 B2
(45) Date of Patent: Jun. 21, 2005

(54) MULTICHIP MODULE AND TESTING METHOD THEREOF

(75) Inventor: Sachio Ogawa, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/621,346

(22) Filed: Jul. 18, 2003

(65) Prior Publication Data

US 2004/0041580 A1 Mar. 4, 2004

(30) Foreign Application Priority Data

Aug. 27, 2002 (JP) ..................................... P.2002-246945

(51) Int. Cl.$^7$ .............................................. G01R 31/26
(52) U.S. Cl. ..................... 324/765; 324/763; 714/727
(58) Field of Search .................... 324/73.1, 763–765, 324/158.1; 257/723, 777, 784, 786; 714/726–727, 729–730

(56) References Cited

U.S. PATENT DOCUMENTS 5,444,715 A * 8/1995 Gruetzner et al. .......... 714/727
5,544,174 A     8/1996 Abend
5,581,176 A * 12/1996 Lee .......................... 324/158.1
5,646,422 A *  7/1997 Hashizume .................. 257/48
6,630,744 B2 * 10/2003 Tsuda .......................... 257/777
6,728,915 B2 *  4/2004 Whetsel ...................... 714/727

FOREIGN PATENT DOCUMENTS

JP      05-13862      1/1993
JP      09-213874     8/1997
JP      10-82834      3/1998

* cited by examiner

Primary Examiner—Minh N. Tang
(74) Attorney, Agent, or Firm—McDermott Will & Emery LLP

(57) ABSTRACT

There are provided a plurality of semiconductor chips 102 and 103 having input/output cells 106 and 107 connected to an external terminal 108 of a multichip module 101 respectively, and test circuits 104 and 105 for the multichip module which serve to optionally set the states of the input/output cells.

3 Claims, 7 Drawing Sheets

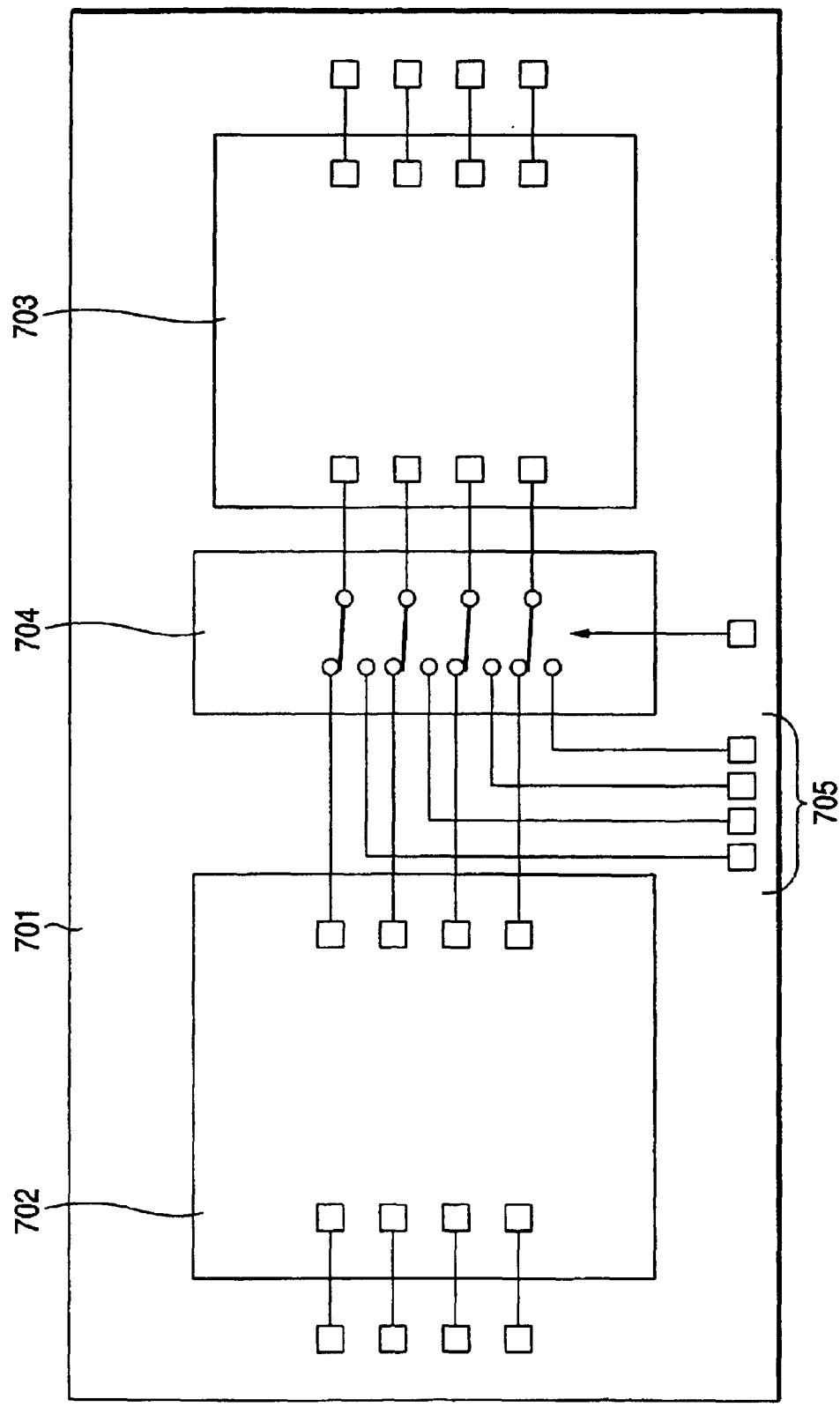
PRIOR ART FIG.7

MULTICHIP MODULE AND TESTING METHOD THEREOF

BACKGROUND OF THE INVENTION

1. Field of the Invention

The present invention relates to a multichip module for mounting a plurality of semiconductor chips and a testing method thereof.

2. Description of the Related Art

The multifunction of an electronic apparatus has been improved and a system constituted by interconnecting a plurality of processors has been used commonly. For a method of mounting such a system, attention has been paid to a multichip module for mounting a plurality of semiconductor chips such as processors on one package as compact mounting.

In such a multichip module, a method of executing a test for the mounted semiconductor chips is a technical problem. Conventionally, a circuit for easily testing a semiconductor chip mounted on the multichip module has been described in the OPI publication JP-A-5-13662.

FIG. 7 is a block diagram showing the structure of the conventional multichip module testing circuit. In FIG. 7, semiconductor chips 702 and 703 such as processors are mounted on a multichip module 701, and the output terminal of the semiconductor chip 702 and the input terminal of the semiconductor chip 703 are connected to each other through a switching chip 704.

The switching chip 704 serves to select the output terminal of the semiconductor chip 702 or an external terminal 705 so as to be connected to the input terminal of the semiconductor chip 703, thereby independently testing the semiconductor chips 702 and 703 in a package.

In this method, however, a switching chip is inserted. For this reason, there is a problem in that the design man-hour of the multichip module is increased and the area of the multichip module is increased, and furthermore, the switching chip is hard to insert in case of a lamination type.

In the case in which the switching chip is not inserted, moreover, there is a problem in that it is necessary to avoid a bus collision in consideration of the state of the semiconductor chip to be mounted in relation to the external terminal to be shared and a design is thereby carried out with difficulty in a DC test, a burn-in test, a scan test and a function test in the test design of the multichip module.

Furthermore, there are a plurality of combinations of the semiconductor chips to be mounted on the multichip module. For this reason, there is a problem in that it is also hard to carry out a design change and an addition at each time.

SUMMARY OF THE INVENTION

In consideration of such a respect, it is an object of the invention to provide a multichip module for easily carrying out the test design of the multichip module and a testing method thereof.

In order to solve the problem, a first aspect of the invention is directed to a multichip module comprising a plurality of semiconductor chips having input/output cells connected to an external terminal of the multichip module respectively, and test means for optionally setting states of the input/output cells.

According to the structure, it is not necessary to add a semiconductor chip for a test when testing the multichip module. A semiconductor chip coupling test and signal monitoring can easily be carried out from the external terminal by only controlling the states of the input/output cells sharing the external terminal.

A second aspect of the invention is directed to the multichip module according to the first aspect, wherein the test means controls the states of all the input/output cells sharing the external terminal.

According to the structure, the states of all the input/output cells sharing the external terminal can be controlled. Consequently, it is possible to easily carry out an isolation test (a function test, a DC test and a scan test) for each semiconductor chip, a coupling test for a plurality of semiconductor chips, and a burn-in test from the external terminal by only controlling the states of the input/output cells sharing the external terminal. Moreover, it is possible to apply a test pattern by only adding the input/output control of the external terminal to be shared to the header of the test pattern of a single semiconductor chip.

A third aspect of the invention is directed to the multichip module according to the first aspect, wherein the test means controls the states of all the input/output cells of the semiconductor chips.

According to the structure, the states of all the input/output cells of the semiconductor chips can be controlled. Consequently, it is possible to test the multichip module which does not depend on the combination of the semiconductor chips.

A fourth aspect of the invention is directed to the multichip module according to any of the first to third aspects, wherein the test means includes a flip-flop group in a first stage which is connected like a shift register, a flip-flop group in a second stage which uses, as an input, an output of the flip-flop group in the first stage, and a selector for selecting a normal signal in a non-test mode, selecting an output of the flip-flop group in the second stage in a test mode and giving an input/output control signal to the input/output cell.

According to the structure, it is possible to easily implement a test circuit for the multichip module to control the input/output cells.

A fifth aspect of the invention is directed to a multichip module comprising a plurality of semiconductor chips having input/output cells connected to an external terminal of the multichip module respectively which are subjected to a boundary scan design, and boundary scan means mounted on the semiconductor chips for optionally setting states of the input/output cells.

According to the structure, it is possible to easily carry out a test design for the multichip module by only performing the boundary scan design to be a general deign in the semiconductor chip. When testing the multichip module, moreover, it is possible to easily carry out an isolation test (a function test, a DC test and a scan test) and a burn-in test for each semiconductor chip by only performing control to avoid a bus collision in the external terminal to be shared, and to apply a test pattern by only adding the input/output control of the external terminal to be shared by the header of the test pattern of the single semiconductor chip.

A sixth aspect of the invention is directed to a multichip module testing method of carrying out a burn-in test for the multichip module according to any of the first to fifth aspects, comprising the steps of toggling an input/output control signal to an input/output cell connected to an external terminal which is not shared by a plurality of semiconductor chips, and toggling an input/output control signal while exclusively controlling a state of the input/output cell of each of semiconductor chips for the input/output cell connected to an external terminal which is shared by the semiconductor chips.

According to the structure, even if the internal circuit of each semiconductor chip is operated randomly, it is possible to easily apply a proper stress to the input/output cells to which the stress is applied with difficulty without causing the bus collision of the external terminal to be shared. Consequently, it is possible to shorten a time required for a test by applying the stress to all the semiconductor chips at the same time.

BRIEF DESCRIPTION OF THE DRAWINGS

FIG. 7 is a block diagram showing the structure of a conventional multichip module.

DESCRIPTION OF THE PREFERRED EMBODIMENTS

Embodiments of the invention will be described below in detail with reference to the drawings.
(First Embodiment)

Figure 1:
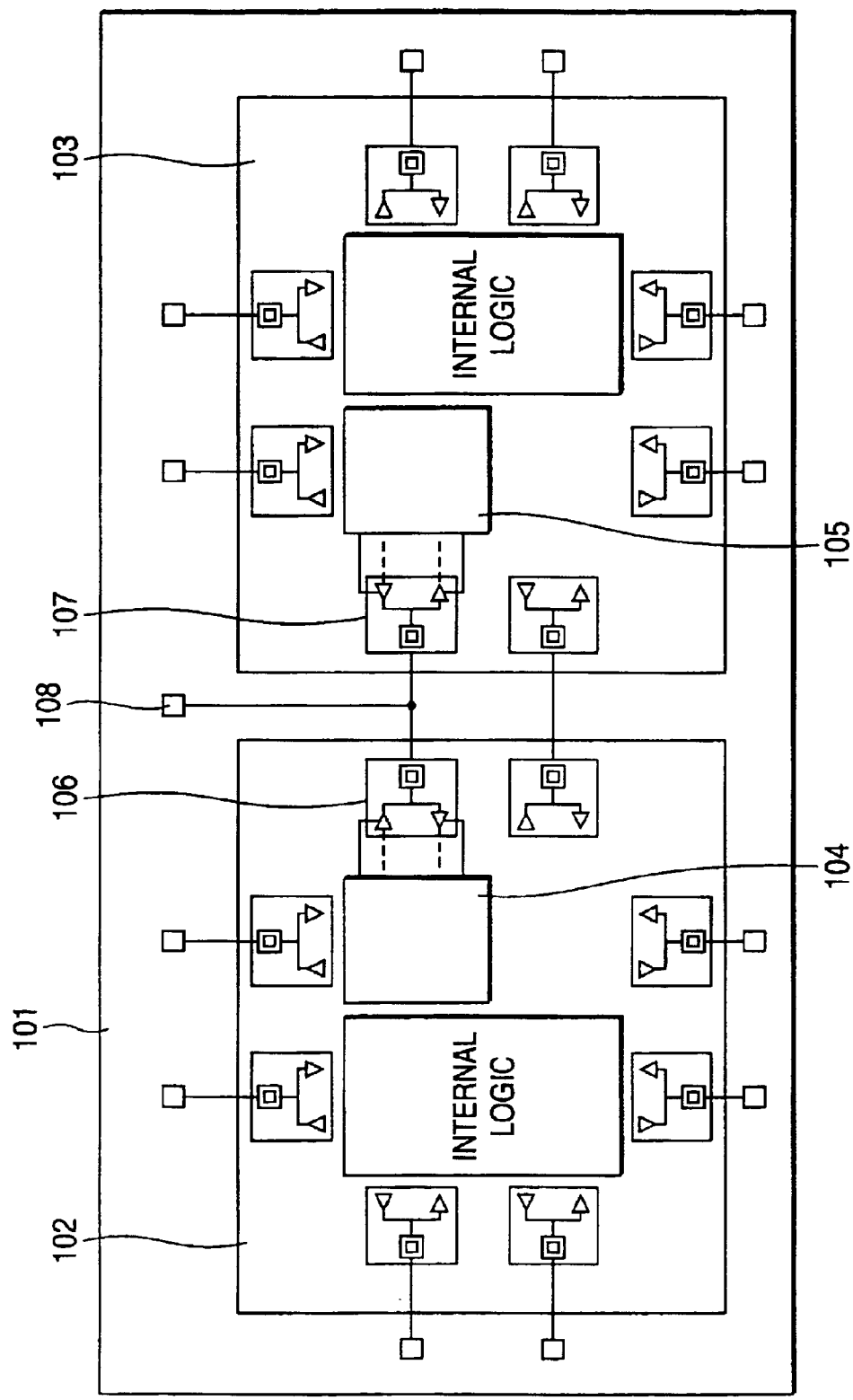
FIG. 1 is a diagram showing the structure of a multichip module according to a first embodiment of the invention.

FIG. 1 is a diagram showing the structure of a multichip module according to a first embodiment of the invention. In FIG. 1, 101 denotes a multichip module, 102 and 103 denote a semiconductor chip, 104 and 105 denote a test circuit for the multichip module, 106 and 107 denote an input/output cell, and 108 denotes an external terminal.

The multichip module 101 mounts the semiconductor chips 102 and 103 thereon, the semiconductor chips 102 and 103 include the test circuits 104 and 105 for the multichip module respectively, the input/output cells 106 and 107 of the respective semiconductor chips 102 and 103 are connected to share the external terminal 108, and input/output control signals sent from the test circuits 104 and 105 for the multichip module are connected to the input/output control inputs of the input/output cells 106 and 107.

Description will be given to the test operation of the multichip module having the structure described above. The test circuits 104 and 105 for the multichip module can set the states of the input/output cells into any optional state of input control, output control and a high impedance in response to the input/output control signals.

During the isolation test of the semiconductor chip 102, the input/output cell 107 is controlled to have a high impedance by the test circuit 105 for the multichip module. Consequently, a bus collision with the input/output cell 106 is avoided to carry out test input or test monitoring through the external terminal 108.

During the isolation test of the semiconductor chip 103, the input/output cell 106 is controlled to have a high impedance by the test circuit 104 for the multichip module. Consequently, a bus collision with the input/output cell 107 is avoided to carry out test input or test monitoring through the external terminal 108.

During the coupling test of the semiconductor chips 102 and 103, the input of the input/output cell 107 is controlled and the output of the input/output cell 106 is controlled or the output of the input/output cell 107 is controlled and the input of the input/output cell 106 is controlled, thereby coupling both of them to carry out the test.

Figure 5:
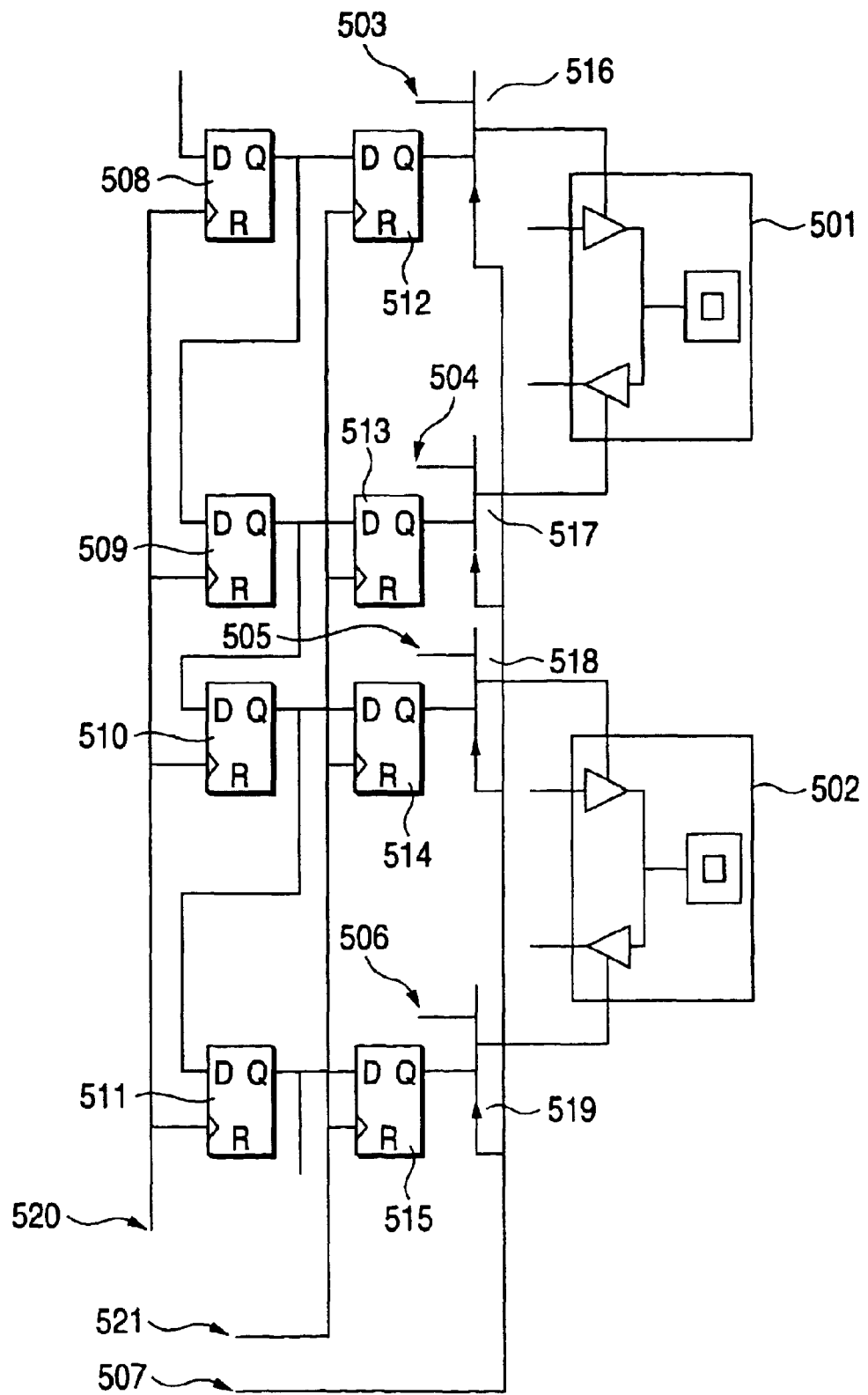
FIG. 5 is a circuit diagram showing the structure of a test circuit for the multichip module.

FIG. 5 is a circuit diagram showing the structure of the test circuit for the multichip module. In FIG. 5, 501 and 502 denote input/output cells, and 516, 517, 518 and 519 denote selectors for selecting normal signals 503, 504, 505 and 506 or the outputs of flip-flop 512, 513, 514 and 515 as the output control signals and the input control signals of the input/output cells 501 and 502 for switching the input in response to a test mode signal 507.

The flip-flops 512, 513, 514 and 515 serve to define the states of the input/output cells, and a load clock 521 having the same system is connected to the clocks of all the flip-flops. Moreover, 508, 509, 510 and 511 denote flip-flops connected serially and a shift clock 520 having the same system is connected thereto.

Description will be given to the operation of the test circuit for the multichip module having the structure described above. In the case in which a normal operation is to be carried out, fixation is performed to select the normal signals 503, 504, 505 and 506 in the selectors 516, 517, 518 and 519 in response to the test mode signal 507.

In the case in which the input/output cells are fixed into an optional state in the test mode, first of all, value to be set are held in the flip-flops 508, 509, 510 and 511 in a first stage in response to the shift clock 520. Next, data are held in the flip-flops 512, 513, 514 and 515 in a next stage in response to the load clock 521. Finally, outputs on the flip-flop side are selected in the selectors 516, 517, 518 and 519 in response to the test mode signal 507. Subsequently, when the state is to be changed, the above process is repeated so that the states of the input/output cells 501 and 502 can be set optionally.

Thus, the test circuit of the multichip module can easily be implemented by a simple circuit. While 508, 509, 510, 511, 512, 513, 514 and 515 are constituted by the flip-flops in the test circuit of the multichip module in FIG. 5, they may be latch circuits.

Figure 6:
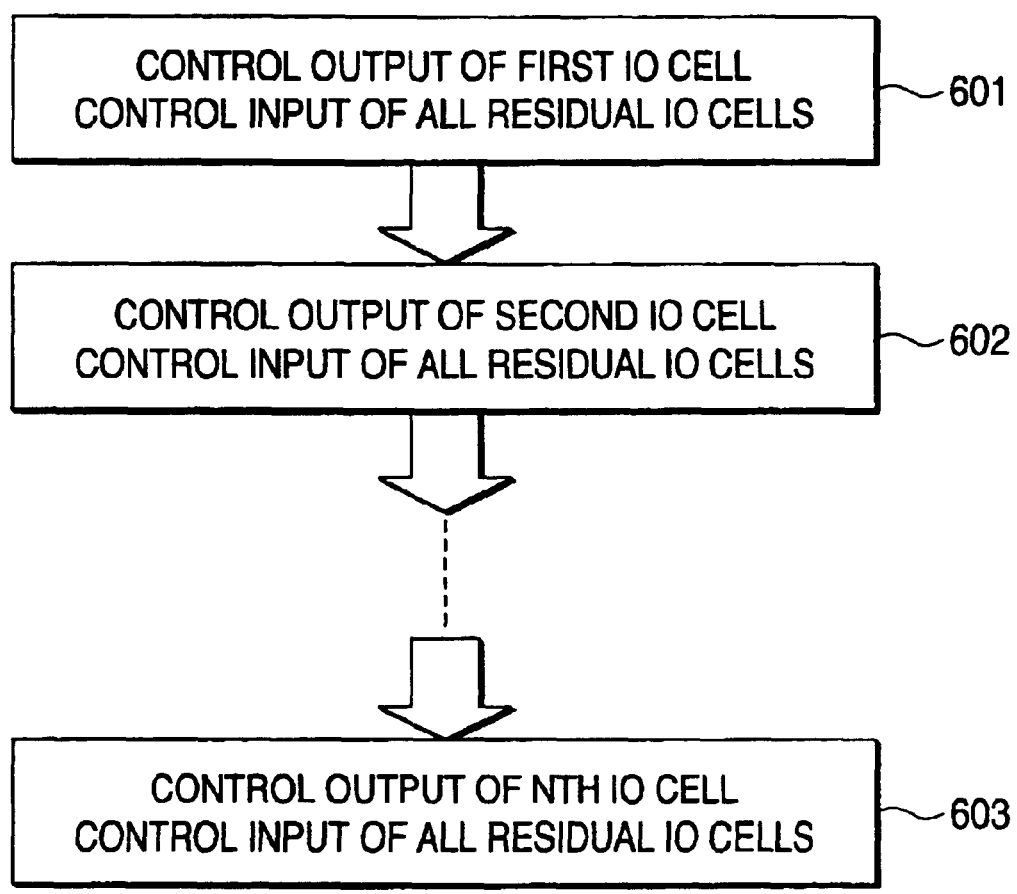
FIG. 6 is a diagram for explaining the burn-in test method of the multichip module.

FIG. 6 is a diagram for explaining the burn-in test method of the multichip module. In FIG. 6, it is supposed that n input/output cells are connected to one external terminal of the multichip module. 601 denotes a first step, 602 denotes a second step, and 603 denotes an nth step.

At the first step 601, only n first input/output cells which are shared are subjected to the output control and the residual input/output cells are subjected to the input control to toggle an internal circuit. At the second step 602, only n second input/output cells which are shared are subjected to the output control and the residual input/output cells are subjected to the input control to toggle the internal circuit. At the nth step 603, only nth input/output cells which are shared are subjected to the output control and the residual input/output cells are subjected to the input control to toggle the internal circuit. Other external terminals which are not shared are also operated randomly.

According to such a burn-in test method, it is possible to prevent a bus collision from being caused on the shared external terminal, thereby easily applying a proper stress to the input/output cells to which a stress is applied with difficulty when such control is not carried out. Consequently, the stress is simultaneously applied to all the semiconductor chips so that a time required for the test can be shortened.

According to the multichip module in accordance with the embodiment, thus, the test circuit for the multichip module is provided to control the states of the input/output cells. Consequently, it is possible to easily carry out a test through the shared external terminal of the multichip module which is tested with difficulty.

(Second Embodiment)

Figure 2:
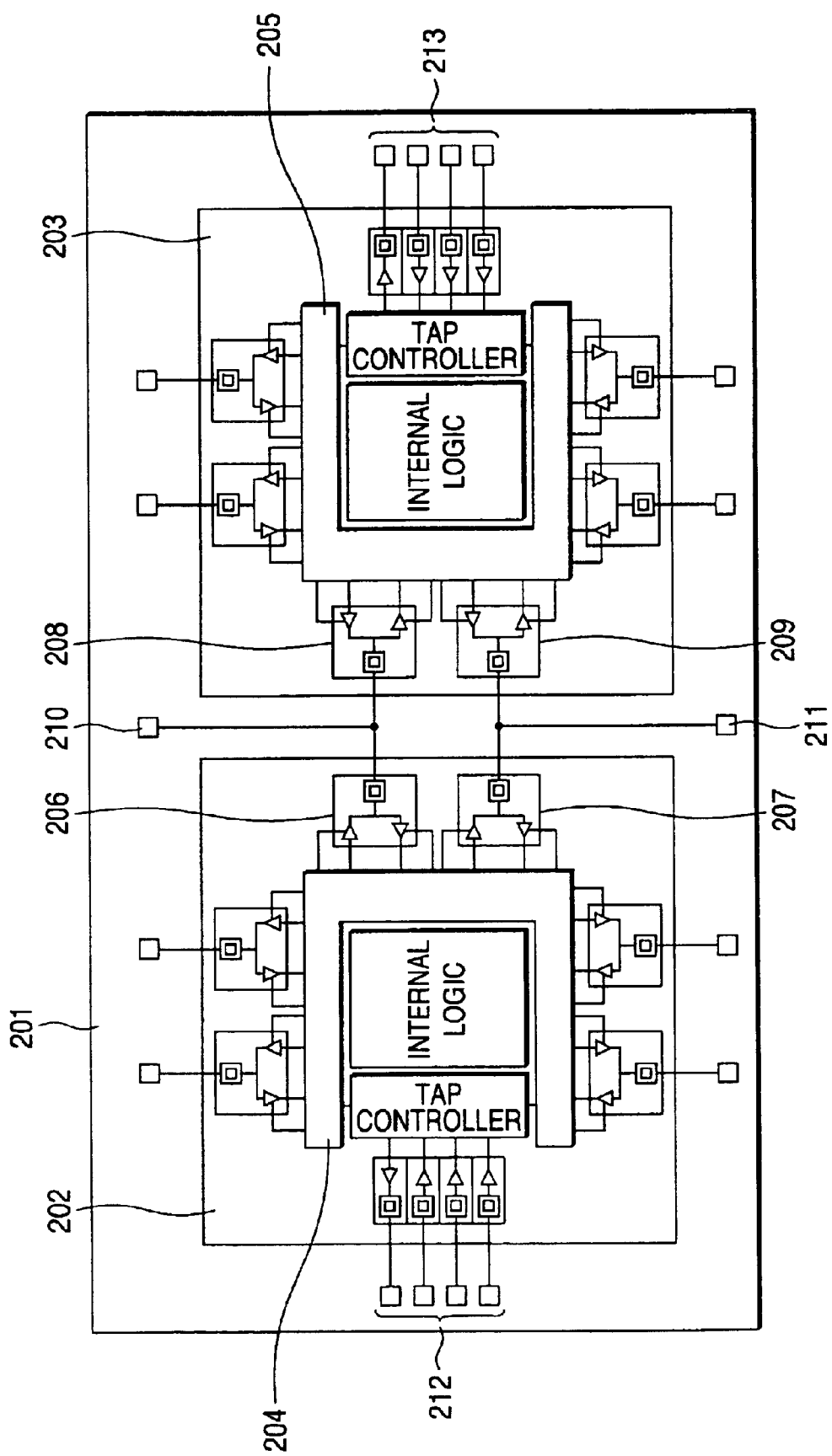
FIG. 2 is a diagram showing the structure of a multichip module according to a second embodiment of the invention.

FIG. 2 is a diagram showing the structure of a multichip module according to a second embodiment of the invention. In FIG. 2, 201 denotes a multichip module, 202 and 203 denote a semiconductor chip, 204 and 205 denote a boundary scan circuit, 206, 207, 208 and 209 denote an input/output cell, and 210, 211, 212 and 213 denote an external terminal.

The multichip module 201 mounts the semiconductor chips 202 and 203 thereon, the semiconductor chips 202 and 203 include the boundary scan circuits 204 and 205 respectively, the input/output cells 206 and 208 of the respective semiconductor chips 202 and 203 are connected to share the external terminal 210, the respective input/output cells 207 and 209 are connected to share the external terminal 211, and input/output control signals sent from the boundary scan circuits 204 and 205 are connected to the input/output control inputs of the input/output cells 206 to 209. Moreover, the external terminals 212 and 213 are specially allocated as test terminals.

Description will be given to the test operation of the multichip module having the structure described above. During the isolation test of the semiconductor chip 202, the boundary scan circuit 205 is controlled from the external terminal 213 and the input/output cells 208 and 209 are thus controlled to have a high impedance. Consequently, a bus collision with the input/output cells 206 and 207 is avoided to carry out test input or test monitoring through the external terminal 210 and 211.

During the isolation test of the semiconductor chip 203, the boundary scan circuit 204 is controlled from the external terminal 212 and the input/output cells 206 and 207 are thus controlled to have a high impedance. Consequently, a bus collision with the input/output cells 208 and 209 is avoided to carry out test input or test monitoring through the external terminals 210 and 211.

According to the multichip module in accordance with the embodiment, thus, when the test design of the multichip module is to be carried out, it is sufficient that a boundary scan design to be a general design is performed in the semiconductor chip. Consequently, the test design can easily be executed.

When the multichip module is to be tested, moreover, it is possible to easily carry out an isolation test (a function test, a DC test and a scan test) of each semiconductor chip. Consequently, it is possible to apply a test pattern by only adding the input/output control of the external terminal shared by the semiconductor chips to the header of the test pattern of the single semiconductor chip.

(Third Embodiment)

Figure 3:
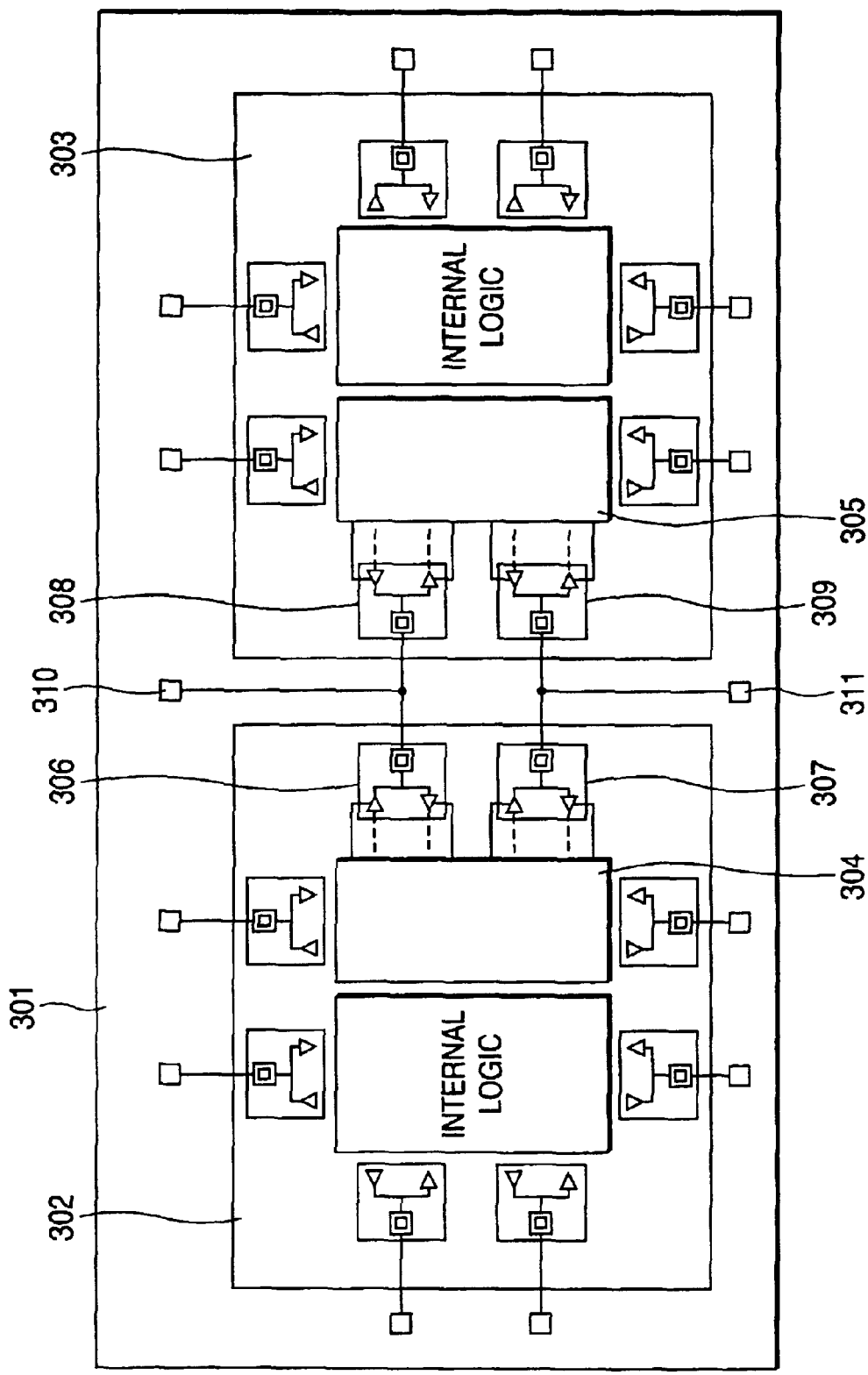
FIG. 3 is a diagram showing the structure of a multichip module according to a third embodiment of the invention.

FIG. 3 is a diagram showing the structure of a multichip module according to a third embodiment of the invention. In FIG. 3, 301 denotes a multichip module, 302 and 303 denote a semiconductor chip, 304 and 305 denote a test circuit for the multichip module, 306, 307, 308 and 309 denote an input/output cell, and 310 and 311 denote an external terminal.

The multichip module 301 mounts the semiconductor chips 302 and 303 thereon, the semiconductor chips 302 and 303 include the test circuits 304 and 305 for the multichip modules respectively, the input/output cells 306 and 308 of the respective semiconductor chips 302 and 303 are connected to share the external terminal 310, the respective input/output cells 307 and 309 are connected to share the external terminal 311, input/output control signals sent from the test circuit 304 for the multichip module are connected to the input/output control inputs of the input/output cells 306 and 307, and input/output control signals sent from the test circuit 305 for the multichip module are connected to the input/output control inputs of the input/output cells 308 and 309. The input/output cells 306, 307, 308 and 309 indicate all of input/output cells sharing the external terminal 311.

Description will be given to the test operation of the multichip module having the structure described above. The test circuits 304 and 305 for the multichip module can set the states of the input/output cells into any optional state of input control, output control and a high impedance in response to an input/output control signal.

During the isolation test of the semiconductor chip 302, the input/output cells 308 and 309 are controlled to have a high impedance by the test circuit 305 for the multichip module. Consequently, a bus collision with the input/output cells 306 and 307 is avoided to carry out test input or test monitoring through the external terminals 310 and 311.

During the isolation test of the semiconductor chip 303, the input/output cells 306 and 307 are controlled to have a high impedance by the test circuit 304 for the multichip module. Consequently, a bus collision with the input/output cells 308 and 309 is avoided to carry out test input or test monitoring through the external terminals 310 and 311.

During the coupling test of the semiconductor chips 302 and 303, the input of the input/output cell 306 is controlled and the output of the input/output cell 308 is controlled or the output of the input/output cell 306 is controlled and the input of the input/output cell 308 is controlled, and furthermore, the input/output cell 307 and the input/output cell 309 are also controlled in the same manner, thereby coupling both of them to carry out the test.

According to the multichip module in accordance with the embodiment, thus, when the multichip module is to be tested, it is possible to easily carry out an isolation test (a function test, a DC test and a scan test) of each semiconductor chip and a coupling test. Consequently, it is possible to apply a test pattern by only adding the input/output control of the external terminal shared by the semiconductor chips to the header of the test pattern of the single semiconductor chip.

(Fourth Embodiment)

Figure 4:
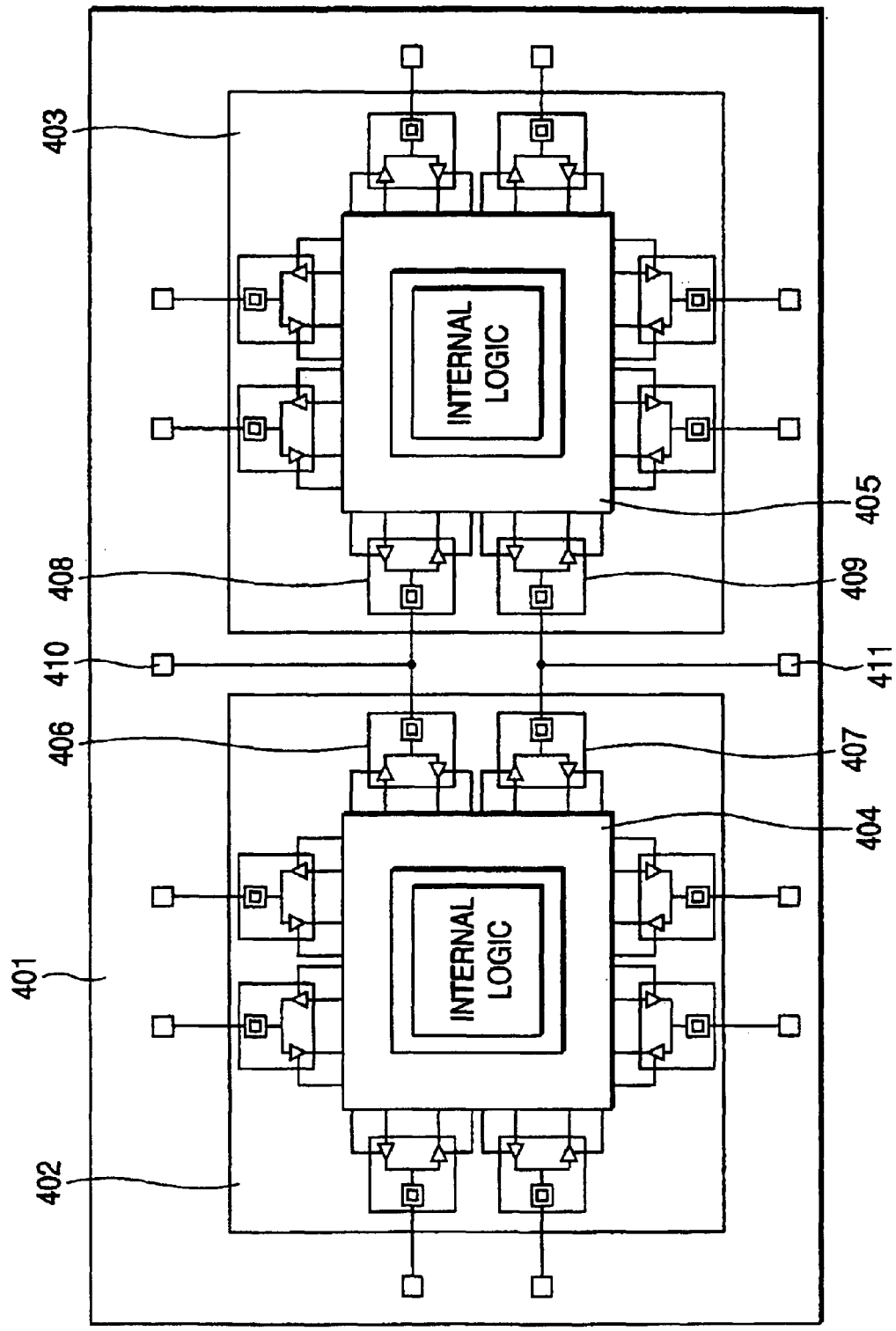
FIG. 4 is a diagram showing the structure of a multichip module according to a fourth embodiment of the invention.

FIG. 4 is a diagram showing the structure of a multichip module according to a fourth embodiment of the invention. In FIG. 4, 401 denotes a multichip module, 402 and 403 denote a semiconductor chip, 404 and 405 denote a test circuit for the multichip module, 406, 407, 408 and 409 denote an input/output cell, and 410 and 411 denote an external terminal.

The multichip module 401 mounts the semiconductor chips 402 and 403 thereon, the semiconductor chips 402 and 403 include the test circuits 404 and 405 for the multichip module respectively, the input/output cells 406 and 408 of the respective semiconductor chips 402 and 403 are connected to share the external terminal 410, and the respective input/output cells 407 and 409 are connected to share the external terminal 411.

The input/output control signals sent from the test circuits 404 and 405 for the multichip module are connected to the input/output control inputs of all the input/output cells of the semiconductor chips 402 and 403, respectively. Consequently, it is possible to set the state of an optional input/output cell into any optional state of input control, output control and a high impedance.

Description will be given to the test operation of the multichip module having the structure described above. During the isolation test of the semiconductor chip 402, the input/output cells 408 and 409 are controlled to have a high impedance by the test circuit 405 for the multichip module. Consequently, a bus collision with the input/output cells 406 and 407 is avoided to carry out test input or test monitoring through the external terminals 410 and 411.

During the isolation test of the semiconductor chip 403, the input/output cells 406 and 407 are controlled to have a high impedance by the test circuit 404 for the multichip module. Consequently, a bus collision with the input/output cells 408 and 409 is avoided to carry out test input or test monitoring through the external terminals 410 and 411.

During the coupling test of the semiconductor chips 402 and 403, the input of the input/output cell 406 is controlled and the output of the input/output cell 408 is controlled or the output of the input/output cell 406 is controlled and the input of the input/output cell 408 is controlled, and furthermore, the input/output cell 407 and the input/output cell 409 are also controlled in the same manner, thereby coupling both of them to carry out the test.

According to the multichip module in accordance with the embodiment, thus, when the multichip module is to be tested, it is possible to easily carry out an isolation test (a function test, a DC test and a scan test) of each semiconductor chip and a coupling test. Consequently, it is possible to apply a test pattern by only adding the input/output control of the external terminal shared by the semiconductor chips to the header of the test pattern of the single semiconductor chip.

Moreover, the states of all the input/output cells of the semiconductor chips can be controlled through the test circuit for the multichip module. Therefore, it is possible to implement the test circuit of the multichip module which does not depend on the combination of the semiconductor chips.

[Advantage of the Invention]

As described above, according to the invention, there is provided the test means for controlling the states of the input/output cells of the semiconductor chips. Consequently, it is not necessary to add a semiconductor chip for a test when testing the multichip module. A semiconductor chip coupling test and signal monitoring can easily be carried out from the external terminal by only controlling the states of input/output cells sharing the external terminal. Thus, it is possible to easily execute a test through the shared external terminal of the multichip module which is tested with difficulty.

According to the structure, furthermore, it is possible to carry out the isolation test of each semiconductor chip (a function test, a DC test and a scan test), the coupling test of the semiconductor chips and the burn-in test from the external terminal by only controlling the states of the input/output cells sharing the external terminal. Moreover, it is possible to apply a test pattern by only adding the input/output control of the external terminal to be shared to the header of the test pattern of a single semiconductor chip.

According to the invention, furthermore, in the case in which the semiconductor chip includes the boundary scan circuit and is subjected to the boundary scan design, it is possible to easily perform a test design for the multichip module by only executing the boundary scan design to be a general deign in the semiconductor chip.

According to the invention, moreover, in the burn-in test of the multichip module, even if the internal circuit of each semiconductor chip is operated randomly, it is possible to easily apply a proper stress to the input/output cells to which the stress is applied with difficulty without causing the bus collision of the external terminal to be shared. Consequently, it is possible to shorten a time required for a test by applying the stress to all the semiconductor chips at the same time.

What is claimed is:

1. A multichip module comprising a plurality of semiconductor chips mounted on said multichip module, wherein each said plurality of semiconductor chips includes at least a plurality of input/output cells connected to a plurality of respective external terminals of the multichip module, and testing means for optionally setting states of said plurality of input/output cells, wherein said test means includes:

a first set of plural flip-flops of which configuration is based on that of a shift register;

a second set of plural flip-flops of which inputs are connected to corresponding outputs of the first set of plural flip-flops; and a selector for selecting a normal signal in a non-test mode, while selecting an output from the second set of flip-flops in a test mode, so as to give an input/output control signal to said plurality of input/output cells.

2. The multichip module according to claim 1, wherein said test means controls all the states of said plurality of input/output cells that are commonly connected to the same external terminals.

3. The multichip module according to claim 1, wherein said test means controls all the states of said plurality of input/output cells of the semiconductor chips.

* * * * *